(12) United States Patent
Yasui et al.

(10) Patent No.: US 11,164,720 B2
(45) Date of Patent: Nov. 2, 2021

(54) SCANNING ELECTRON MICROSCOPE AND CALCULATION METHOD FOR THREE-DIMENSIONAL STRUCTURE DEPTH

(71) Applicant: HITACHI HIGH-TECH CORPORATION, Tokyo (JP)

(72) Inventors: Kenji Yasui, Tokyo (JP); Mayuka Osaki, Tokyo (JP); Makoto Suzuki, Tokyo (JP); Hirohiko Kitsuki, Tokyo (JP); Toshiyuki Yokosuka, Tokyo (JP); Daisuke Bizen, Tokyo (JP); Yusuke Abe, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 16/747,761

(22) Filed: Jan. 21, 2020

(65) Prior Publication Data
US 2020/0234916 A1    Jul. 23, 2020

(30) Foreign Application Priority Data

Jan. 22, 2019 (JP) .............................. JP2019-008299

(51) Int. Cl.
*H01J 37/28* (2006.01)
*H01J 37/244* (2006.01)
(Continued)

(52) U.S. Cl.
CPC .......... *H01J 37/28* (2013.01); *G01N 23/2251* (2013.01); *H01J 37/20* (2013.01);
(Continued)

(58) Field of Classification Search
CPC .... H01J 37/28; H01J 37/244; H01J 2237/221; H01J 2237/2817; H01J 2237/24485;
(Continued)

(56) References Cited

U.S. PATENT DOCUMENTS

| 6,426,501 B1 * | 7/2002 | Nakagawa | H01J 37/28 |
| | | | 250/252.1 |
| 7,807,980 B2 * | 10/2010 | Shishido | H01J 37/265 |
| | | | 250/492.1 |

(Continued)

FOREIGN PATENT DOCUMENTS

| JP | 2017-191758 A | 10/2017 |
| KR | 20160046837 A | 4/2016 |

(Continued)

OTHER PUBLICATIONS

Office Action dated Dec. 8, 2020 in corresponding Taiwanese Application No. 109101907.
Office Action dated Jul. 6, 2021 in Korean Application No. 10-2019-0171462.

*Primary Examiner* — David A Vanore
(74) *Attorney, Agent, or Firm* — Miles & Stockbridge, P.C.

(57) ABSTRACT

To measure a depth of a three-dimensional structure, for example, a hole or a groove, formed in a sample without preparing information in advance, an electron microscope detects, among emitted electrons generated by irradiating a sample with a primary electron beam, an emission angle in a predetermined range, the emission angle being formed between an axial direction of the primary electron beam and an emission direction of the emitted electrons, and outputs a detection signal corresponding to the number of the emitted electrons detected. An emission angle distribution of a detection signal is obtained based on a plurality of detection signals, and an opening angle is obtained based on a change point of the emission angle distribution, the opening angle being based on an optical axis direction of the primary electron beam with respect to the bottom portion of the three-dimensional structure.

15 Claims, 16 Drawing Sheets

(51) Int. Cl.
*H01J 37/20* (2006.01)
*G01N 23/2251* (2018.01)

(52) U.S. Cl.
CPC ....... *H01J 37/244* (2013.01); *H01J 2237/221* (2013.01); *H01J 2237/2817* (2013.01)

(58) Field of Classification Search
CPC ... H01J 2237/24495; H01J 2237/24578; H01J 2237/2814; H01J 37/285; H01J 2237/20228; H01J 2237/24465; H01J 2237/24475; H01J 2237/2449; H01J 2237/245; H01J 2237/24564; H01J 2237/2809; H01J 2237/2826; H01J 37/05; H01J 37/222; H01J 37/256; H01J 37/20; H01J 2237/20235; H01J 2237/281; H01J 37/265; G01N 23/2251
USPC ............... 250/310, 252.1, 307, 492.1, 492.2, 250/492.21, 492.3
See application file for complete search history.

(56) References Cited

U.S. PATENT DOCUMENTS

| | | | |
|---|---|---|---|
| 2006/0202119 A1* | 9/2006 | Yamada | H01J 37/256 250/310 |
| 2012/0274757 A1* | 11/2012 | Bai | H01J 37/28 348/79 |
| 2013/0245989 A1* | 9/2013 | Kadowaki | H01J 37/222 702/150 |
| 2014/0001360 A1* | 1/2014 | Kasai | G06T 1/00 250/307 |
| 2016/0379798 A1 | 12/2016 | Shishido et al. | |
| 2017/0301513 A1* | 10/2017 | Osaki | H01J 37/285 |
| 2018/0336671 A1* | 11/2018 | Schwarzband | G06T 7/60 |

FOREIGN PATENT DOCUMENTS

| | | |
|---|---|---|
| TW | 473892 B | 1/2002 |
| TW | 201901290 A | 1/2019 |

* cited by examiner

[FIG. 1]
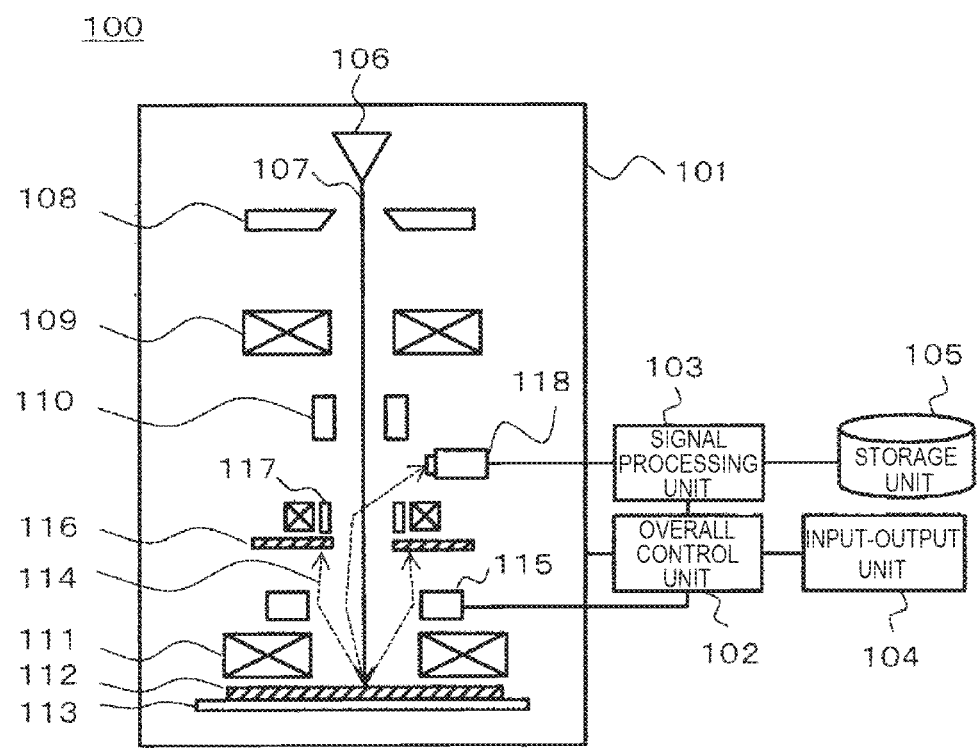

[FIG. 2A]
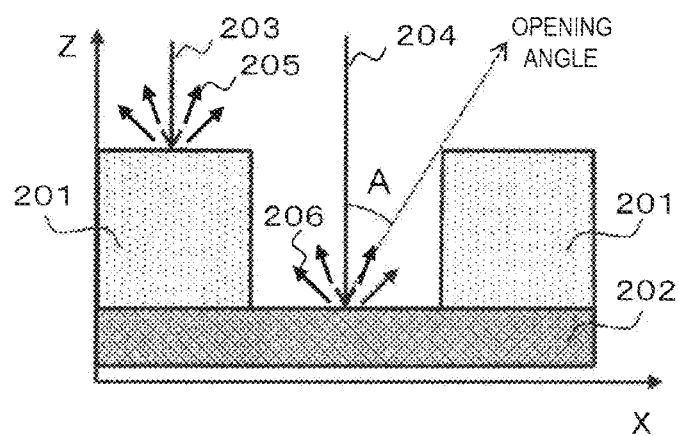
[FIG. 2B]
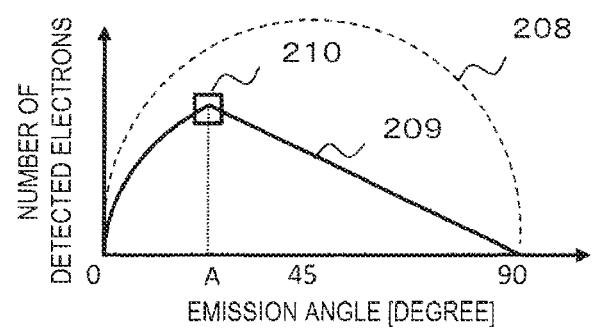

[FIG. 3]
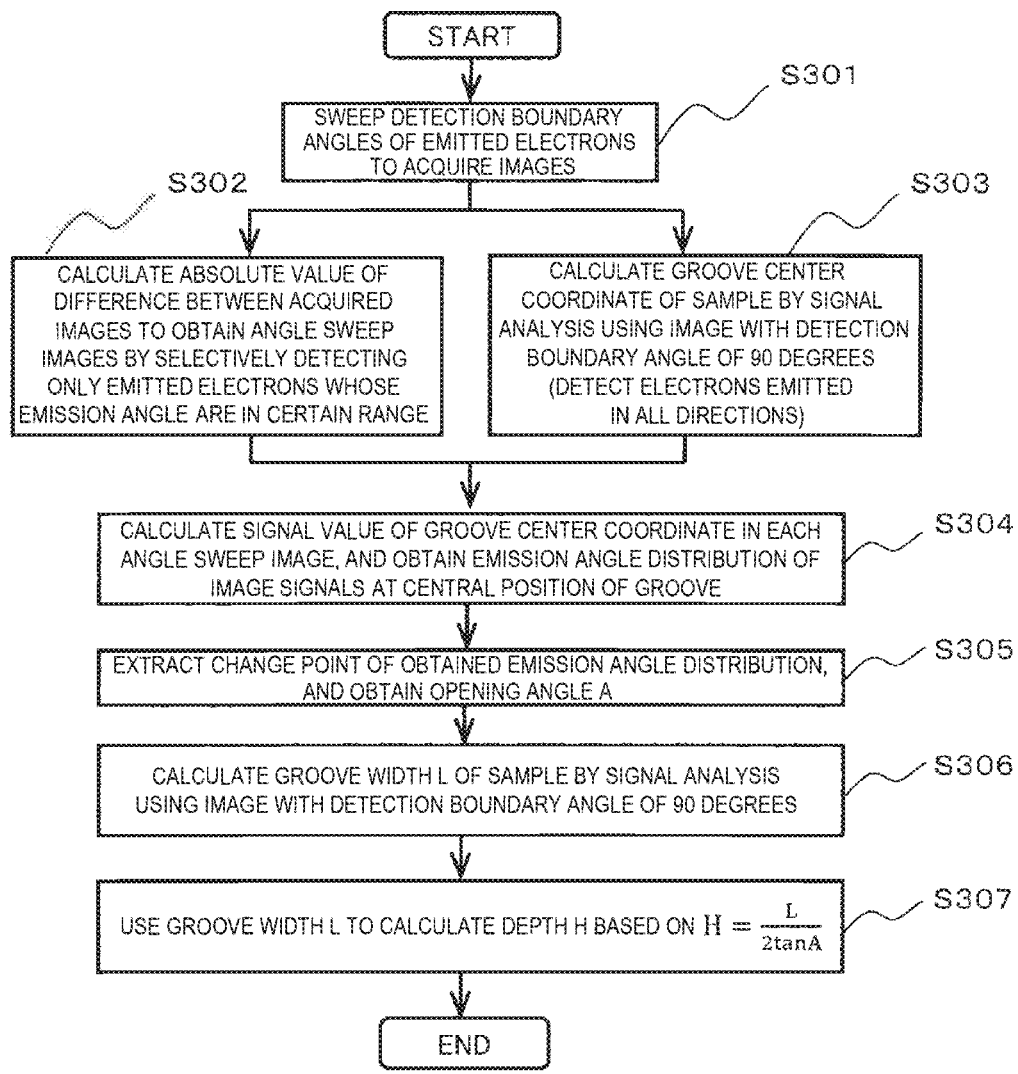

[FIG. 4]
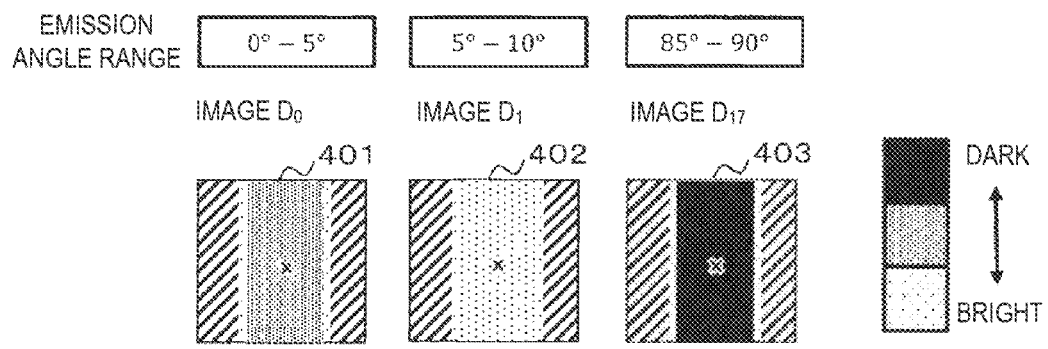
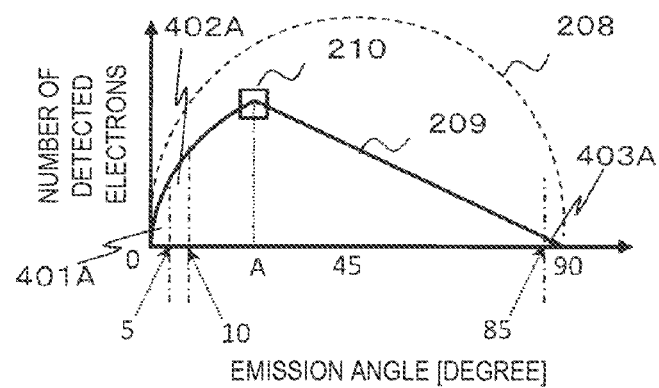

[FIG. 5]
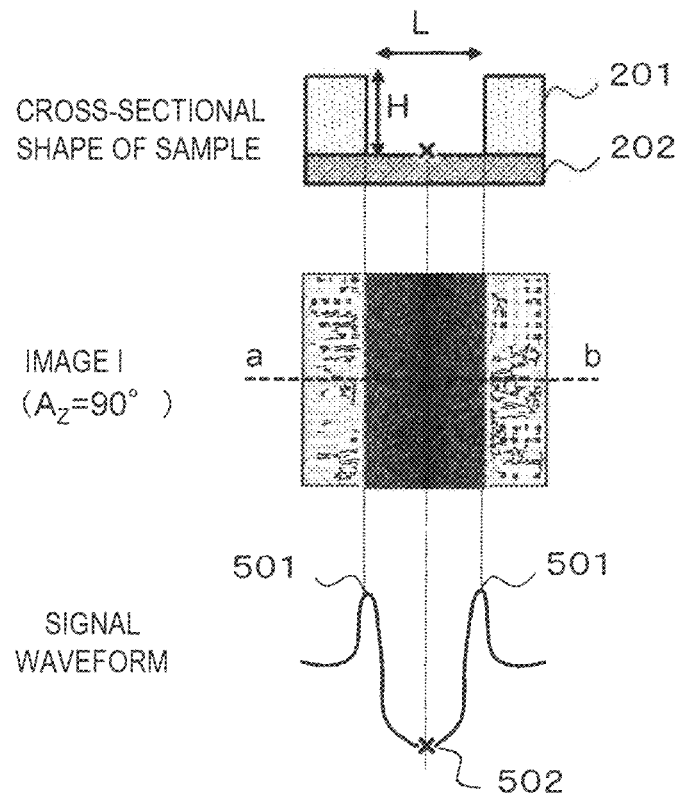
[FIG. 6]
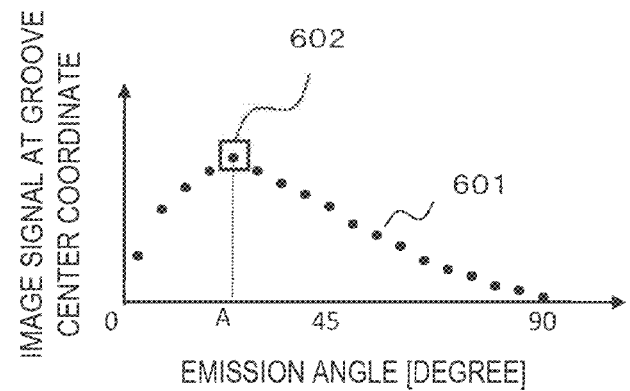

[FIG. 7]
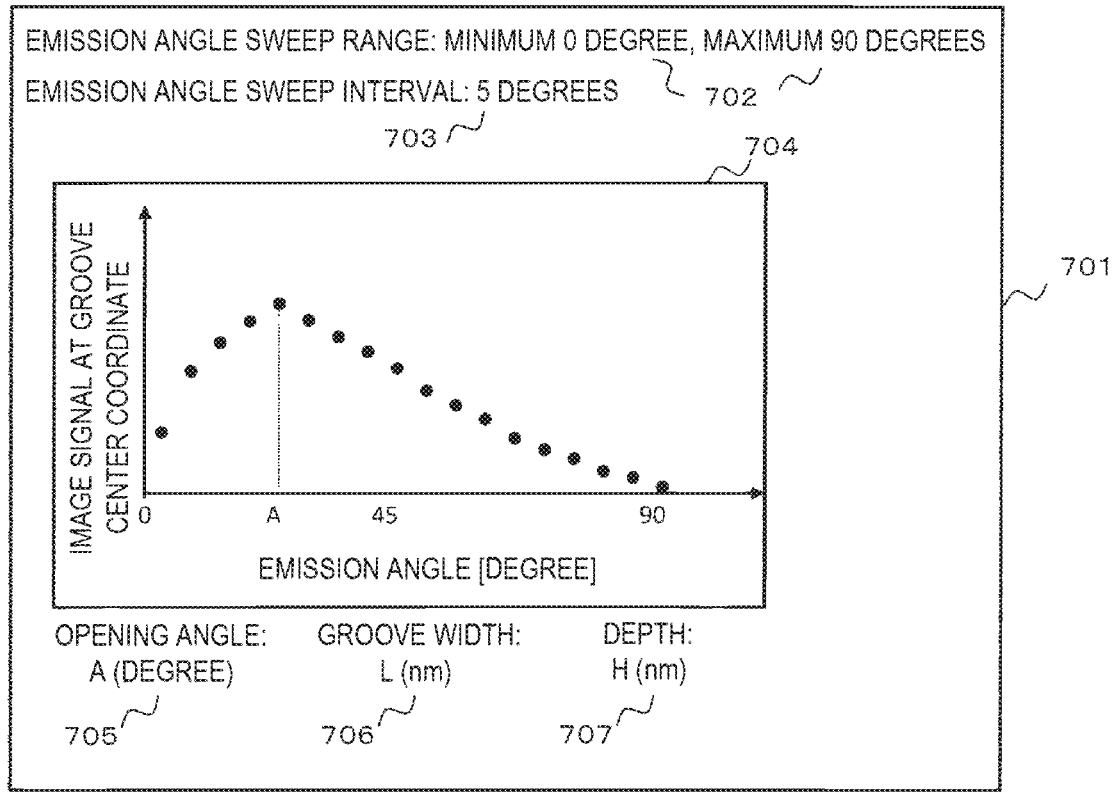

[FIG. 8]
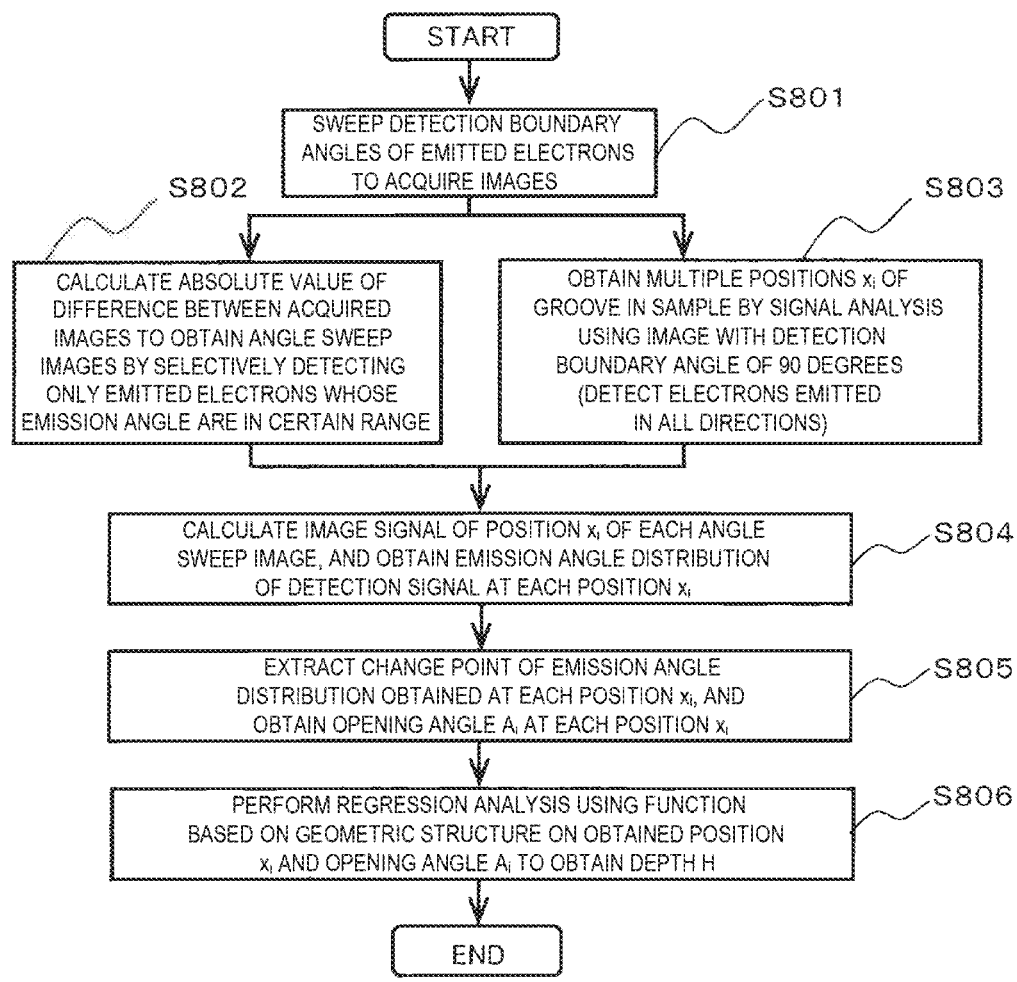

[FIG. 9]
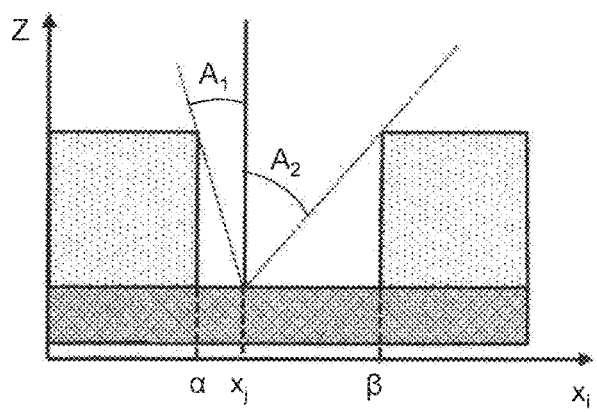
[FIG. 10]
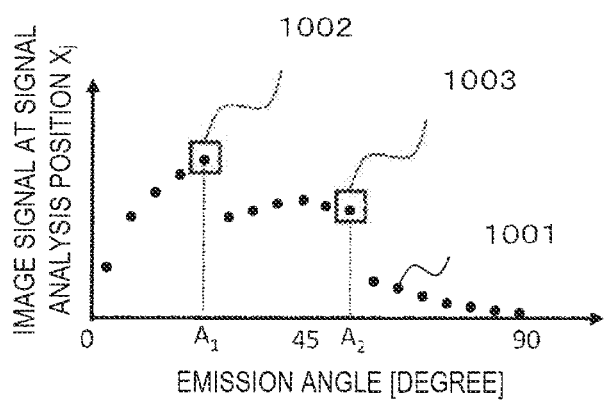
[FIG. 11A]
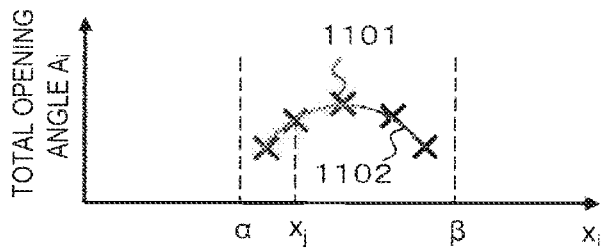

[FIG. 11B]
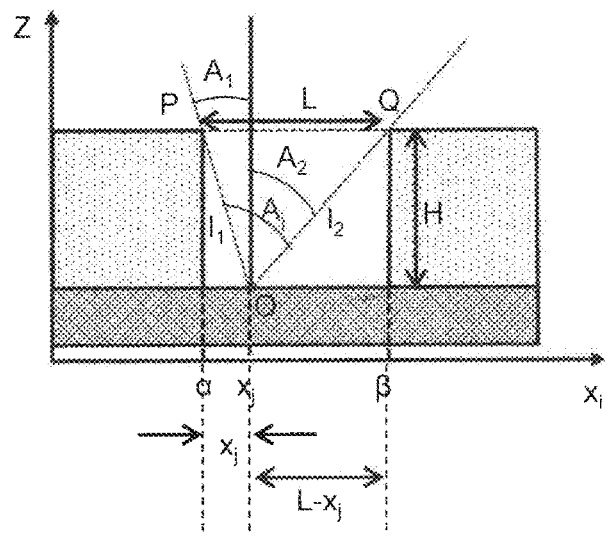
[FIG. 12A]
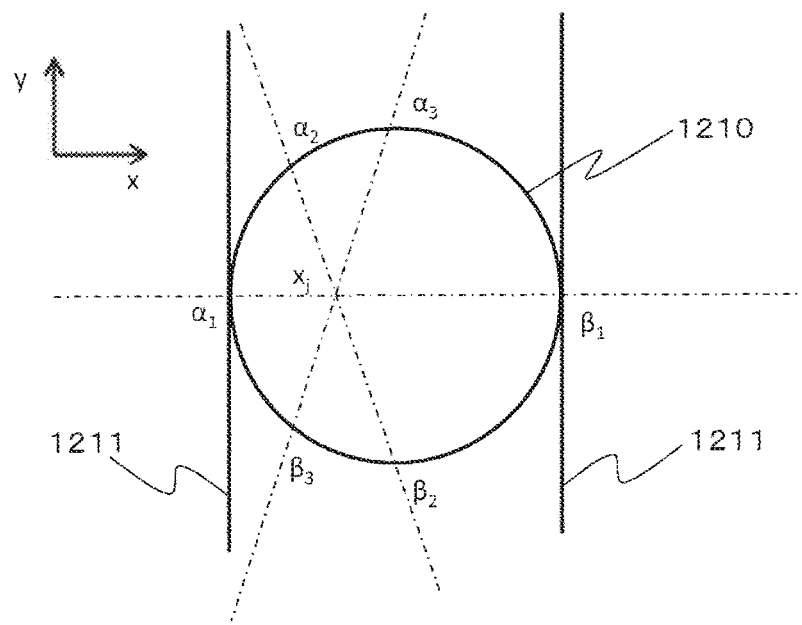

[FIG. 12B]
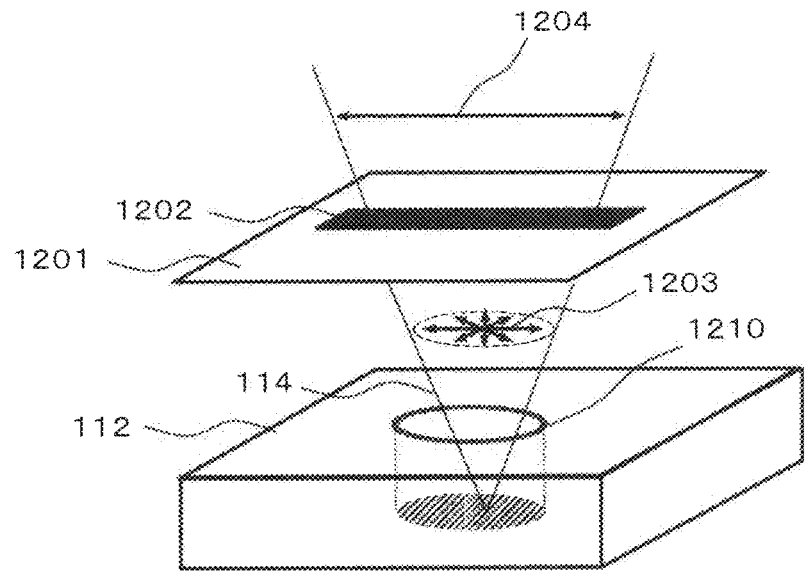
[FIG. 13]
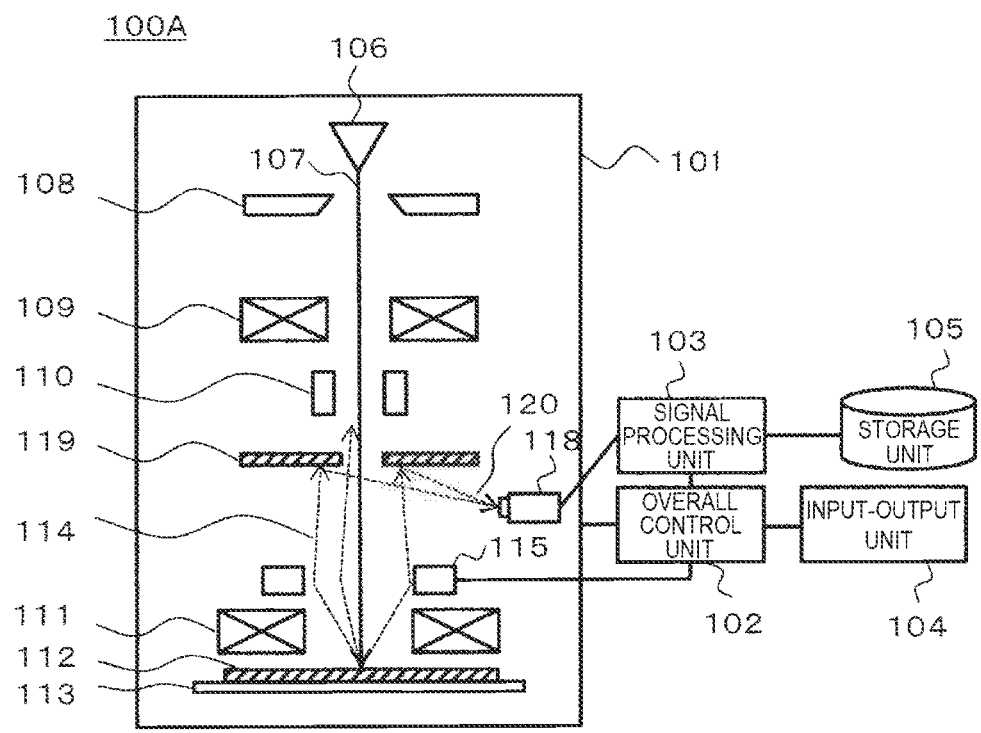

[FIG. 14]
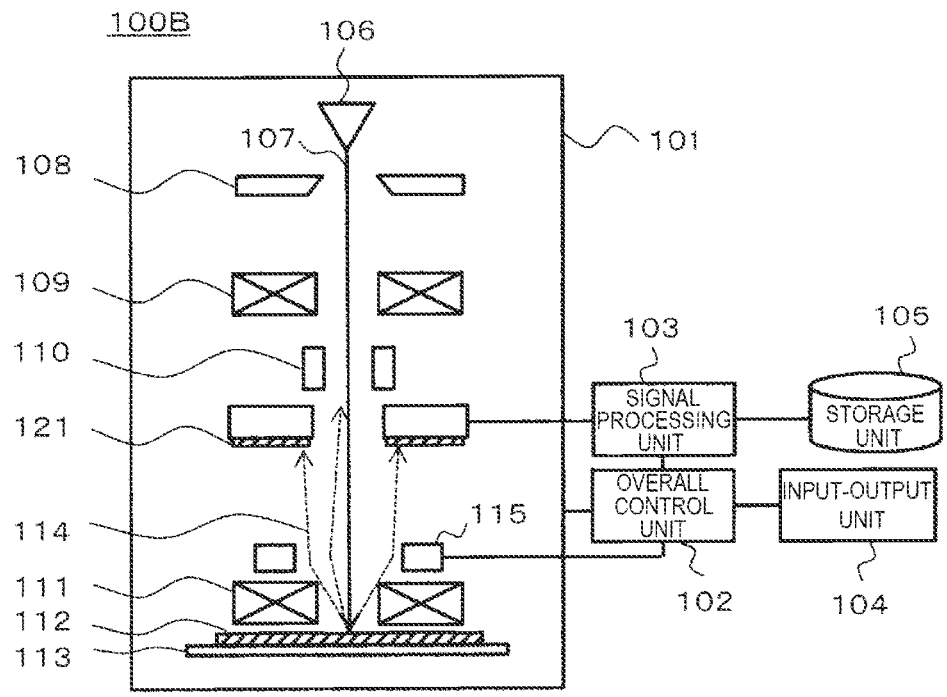
[FIG. 15]
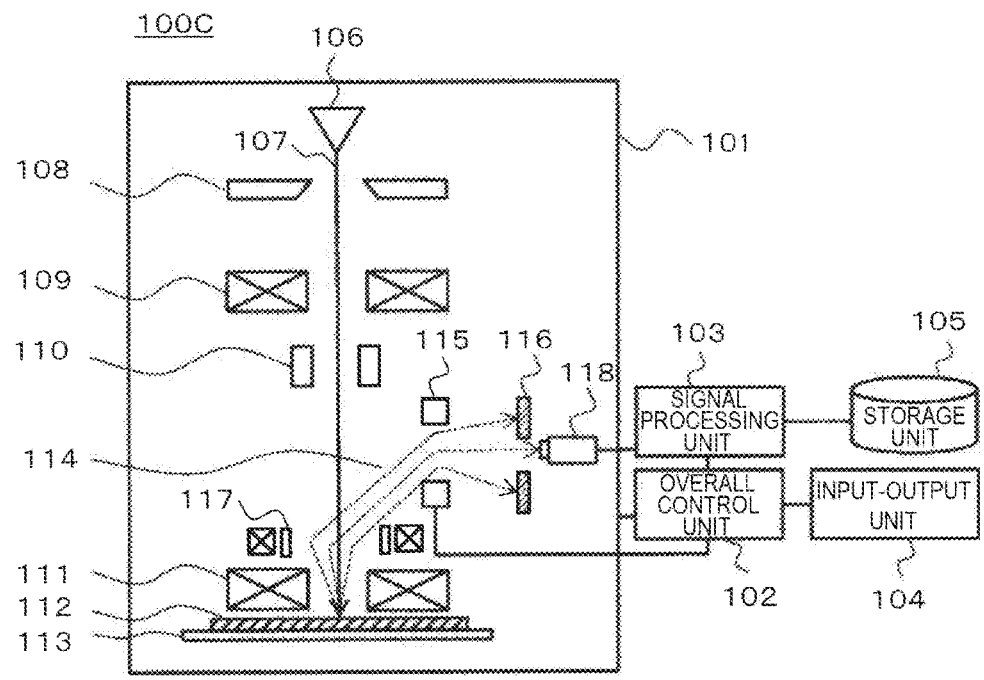

[FIG. 16]
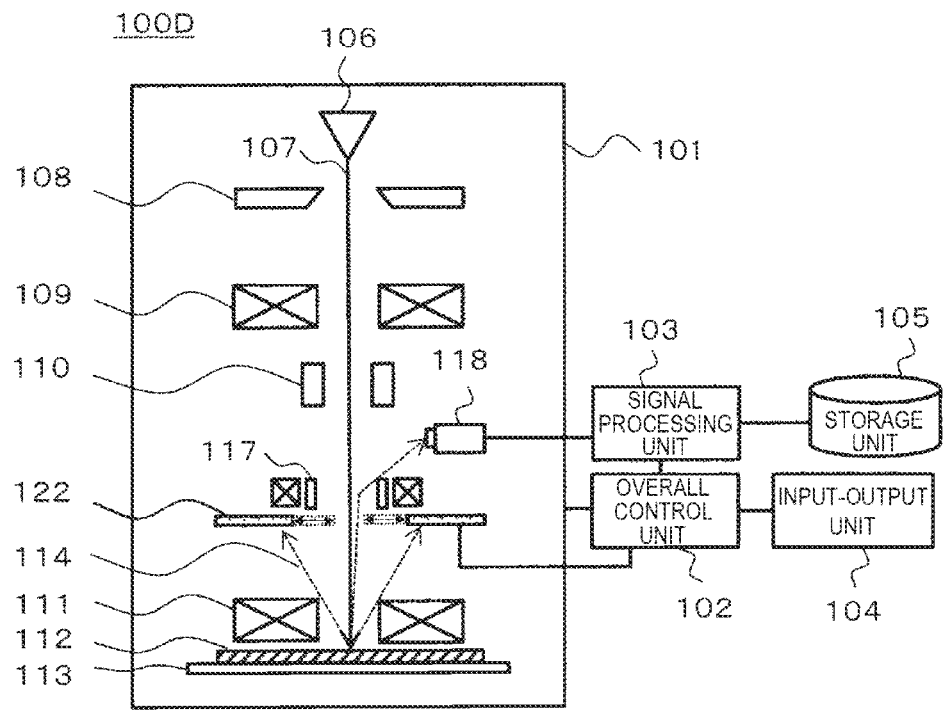
[FIG. 17]
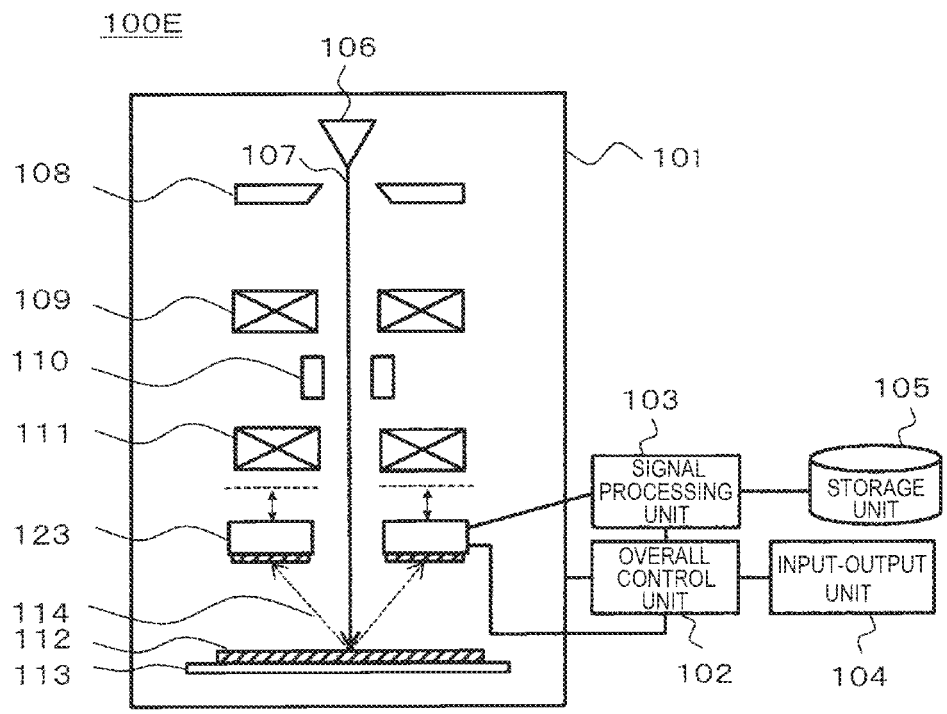

[FIG. 18]
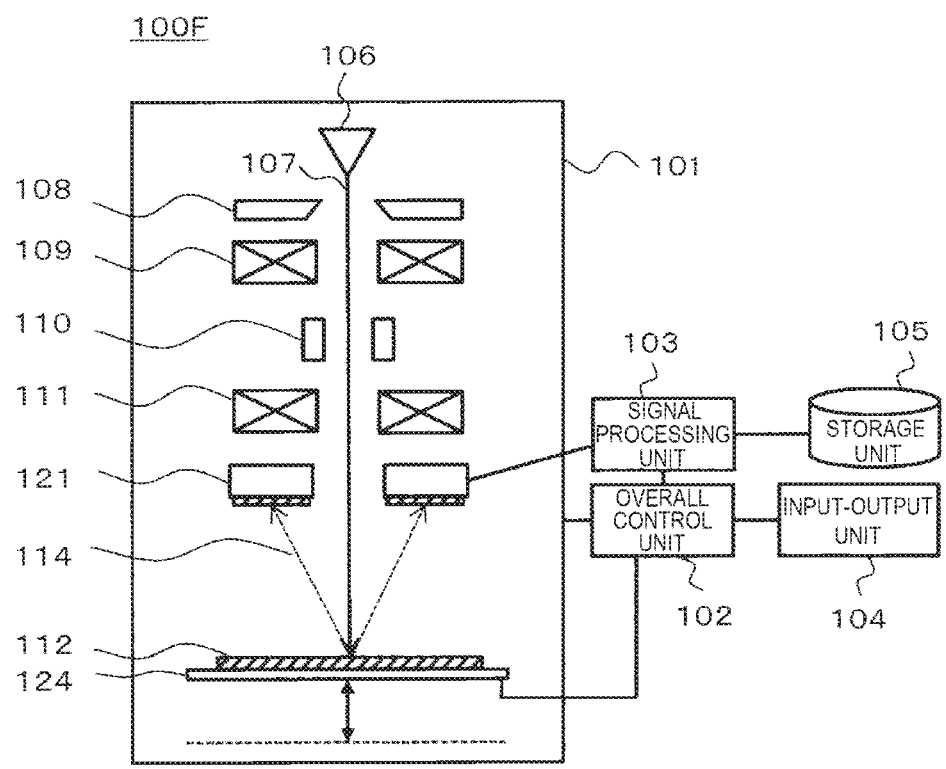

[FIG. 19]
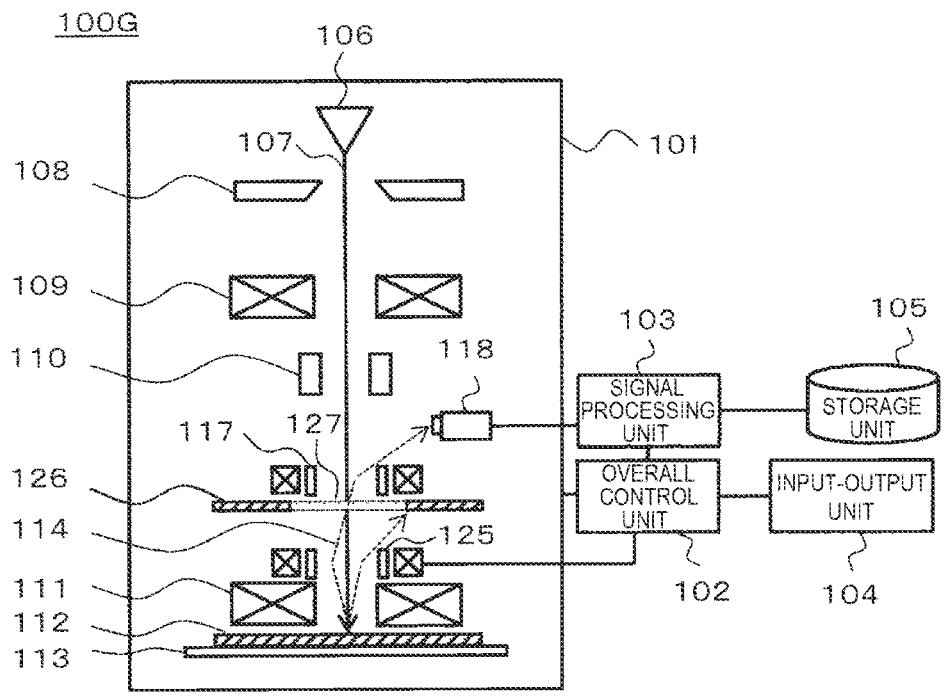
[FIG. 20]
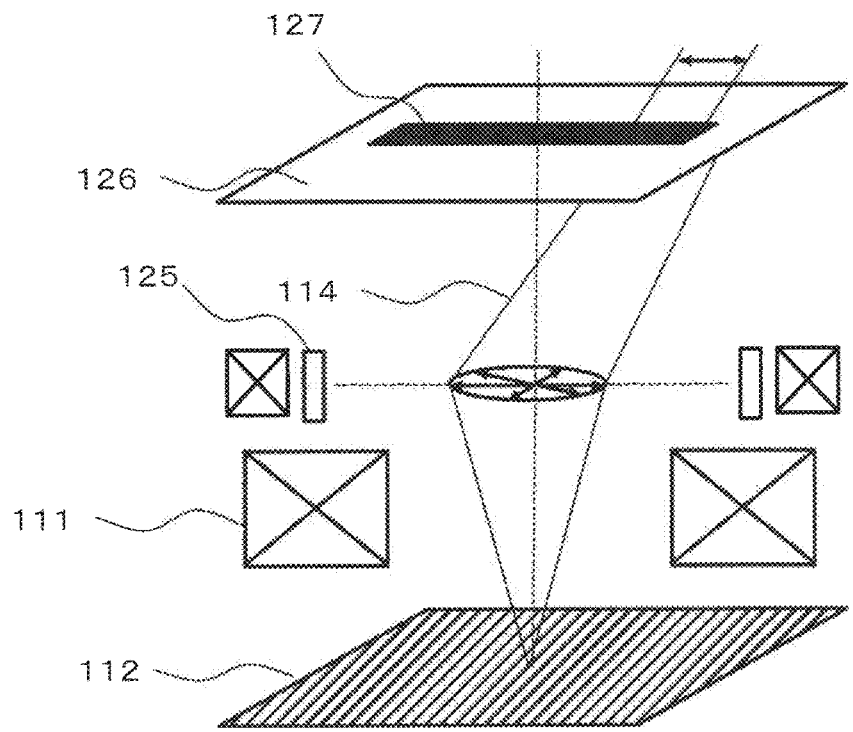

[FIG. 21A]
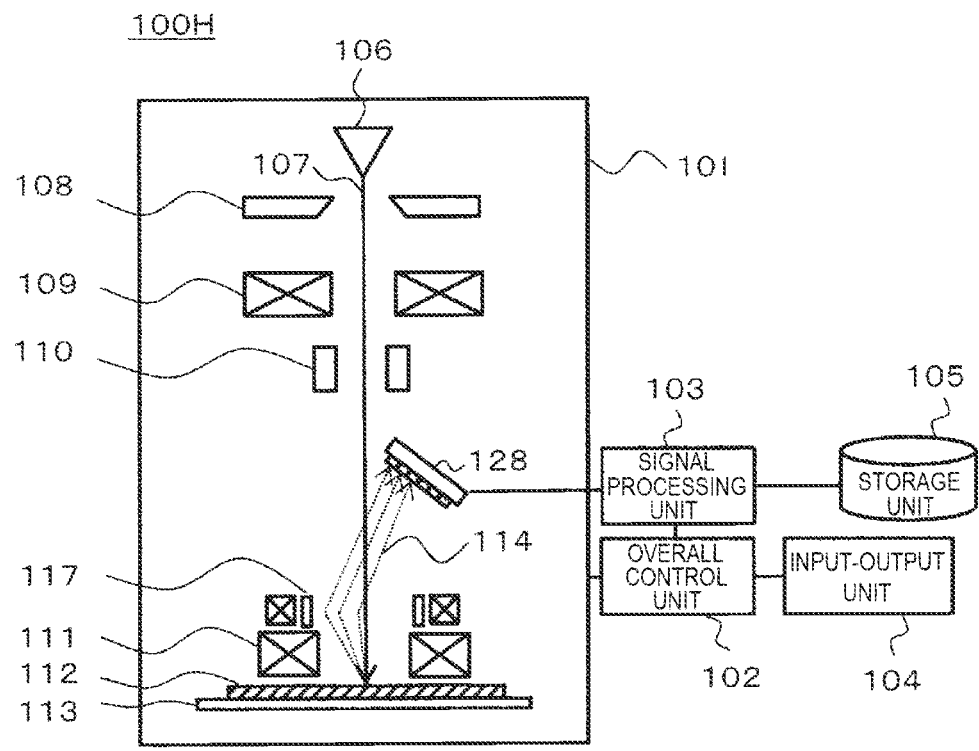
[FIG. 21B]
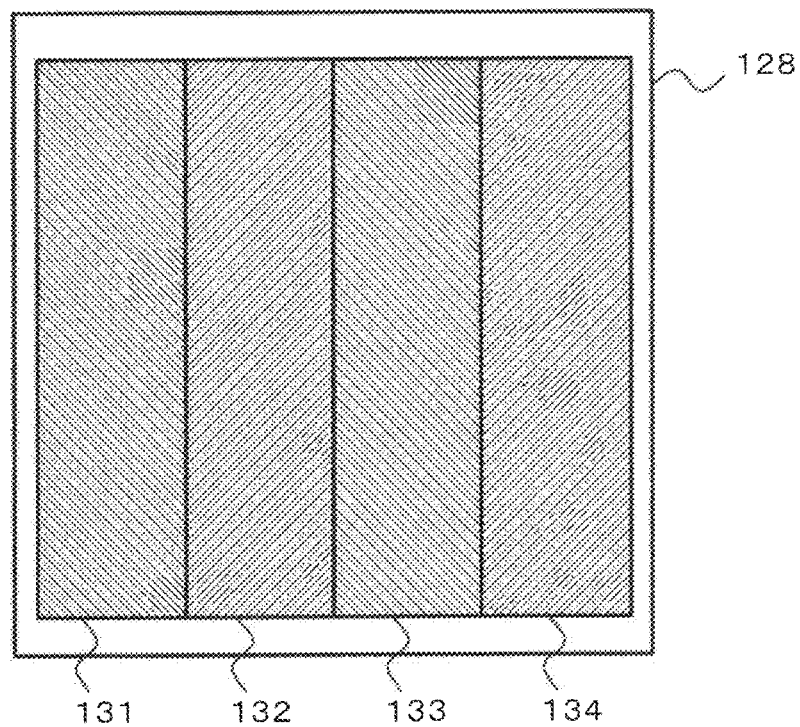

[FIG. 22]
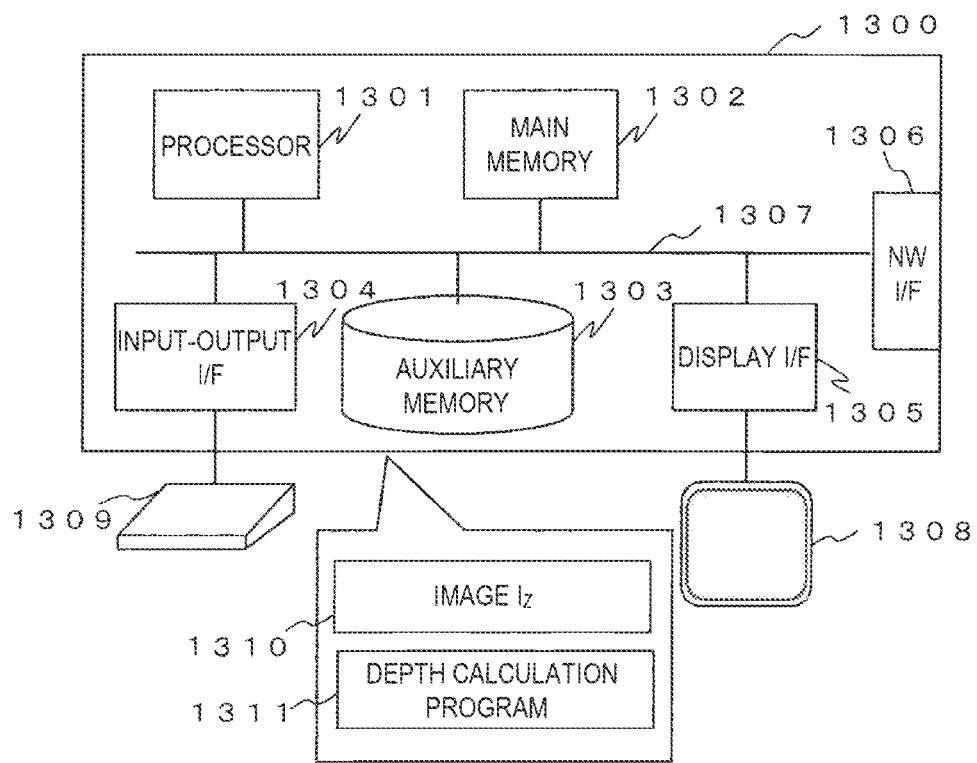

SCANNING ELECTRON MICROSCOPE AND CALCULATION METHOD FOR THREE-DIMENSIONAL STRUCTURE DEPTH

CROSS-REFERENCE TO RELATED APPLICATION

This application claims priority to Japanese Patent Application No. 2019-008299 filed on Jan. 22, 2019, the entire contents of which are incorporated by reference herein.

TECHNICAL FIELD

The present invention relates to a scanning electron microscope and a calculation method for a three-dimensional structure depth, the three-dimensional structure being formed in a sample.

BACKGROUND ART

PTL 1 is used as a background art on depth and height measurement based on luminance of an image of an electron microscope. PTL 1 describes "a scanning electron microscope comprising: a beam source that irradiates a primary electron beam; a detection unit that detects secondary electrons generated from a measurement object by irradiation of the primary electron beam to the measurement object; and a processing unit that processes a signal detected with the detection unit, wherein the detection unit has: a first detection unit that detects a secondary electron at an angle between an optical axis direction of the primary electron beam irradiated to the measurement object and an emission direction of the secondary electron from the measurement object equal to or less than a predetermined value; and a second detection unit that detects the secondary electron at an angle between the optical axis direction of the primary electron beam irradiated to the measurement object and the emission direction of the secondary electron from the measurement object greater than the predetermined value, and wherein the processing unit obtains a ratio between signals outputted from the first detection unit and the second detection unit, and obtains information on a step pattern formed on the measurement object by using information on the obtained ratio."

CITATION LIST

Patent Literature

PTL 1: JP-A-2017-191758

SUMMARY OF INVENTION

Technical Problem

PTL 1 discloses that the scanning electron microscope obtains a depth of a step pattern of a groove based on a relationship stored in advance between a ratio of signals obtained by two detectors and an opening angle of a groove portion of the step pattern. That is, in a processing method of PTL 1, it is necessary to prepare the relationship between the ratio of signals and the opening angle of the groove portion of the step pattern for each imaging target in advance.

It is desirable to be capable of measuring a depth of a three-dimensional structure, for example, a hole or a groove, formed in a sample without preparing information for each pattern or calibration in advance.

Solution to Problem

An electron microscope according to one embodiment of the invention includes: an electron gun configured to irradiate a sample formed in a three-dimensional structure with a primary electron beam; a detection unit configured to detect, among emitted electrons generated from the sample by irradiating the sample with the primary electron beam, emitted electrons whose emission angles are in a predetermined range, the emission angle being an angle formed between an optical axis direction of the primary electron beam and an emission direction of the emitted electrons from the sample, and to output a detection signal corresponding to the number of the emitted electrons which are detected; a control unit configured to control a range of the emission angles of the emitted electrons detected by the detection unit; and a signal processing unit, wherein the control unit is configured to set a plurality of ranges of emission angles of the emitted electrons detected by the detection unit, and the signal processing unit is configured to obtain an emission angle distribution of a plurality of detection signals based on the plurality of detection signals output by the detection unit, the detection signals being obtained by detecting emitted electrons having emission angles in each of the plurality of ranges of emission angles set by the control unit, the emitted electrons being generated by causing the electron gun to irradiate a bottom portion of the three-dimensional structure with the primary electron beam, and to obtain an opening angle based on a change point of the emission angle distribution, the opening angle being an angle formed between the optical axis direction of the primary electron beam and a straight line that passes through a position irradiated with the primary electron beam in the bottom portion of the three-dimensional structure and an upper end of a side wall of the three-dimensional structure.

Advantageous Effect

A depth of a three-dimensional structure formed in a sample can be measured without preparing information for each pattern or calibration in advance.

Other problems and novel characteristics will become apparent from a description of the description and the accompanying drawings.

BRIEF DESCRIPTION OF DRAWINGS

FIG. 1 is a schematic configuration diagram of a scanning electron microscope 100.

FIG. 2A is a schematic view illustrating a state of electron emission accompanying electron beam irradiation on a sample in which a groove is formed.

FIG. 2B is a graph (schematic diagram) illustrating an emission angle distribution of detected electrons.

FIG. 3 is a flowchart for calculating a groove depth according to a first embodiment.

FIG. 4 is an example of acquired images (schematic diagram) obtained by sweeping detection boundary angles.

FIG. 5 is a diagram for illustrating how to obtain a central position of a groove.

FIG. 6 is a graph (schematic diagram) of an emission angle distribution of image signals at the central position of the groove.

FIG. 7 is an output screen of a groove depth measurement.

FIG. 8 is a flowchart for calculating a groove depth according to a second embodiment.

FIG. 9 is a diagram illustrating an example of a signal analysis position $x_i$ and opening angles at this time.

FIG. 10 is a graph (schematic diagram) of an emission angle distribution of image signals at the signal analysis position $x_i$.

FIG. 11A is a graph (schematic diagram) in which opening angles $A_j$ obtained with respect to a signal analysis position $x_j$ are plotted.

FIG. 11B is a diagram for illustrating how to obtain a fitting function.

FIG. 12A is a diagram for illustrating an influence of an azimuth angle of an emitted electron on detection of an opening angle.

FIG. 12B is a diagram illustrating an electron passage restricting member that restricts the azimuth angle of the emitted electrons.

FIG. 13 is a schematic configuration diagram of a scanning electron microscope 100A.

FIG. 14 is a schematic configuration diagram of a scanning electron microscope 100B.

FIG. 15 is a schematic configuration diagram of a scanning electron microscope 100C, FIG. 16 is a schematic configuration diagram of a scanning electron microscope 100D, FIG. 17 is a schematic configuration diagram of a scanning electron microscope 100E.

FIG. 18 is a schematic configuration diagram of a scanning electron microscope 100F.

FIG. 19 is a schematic configuration diagram of a scanning electron microscope 100G.

FIG. 20 is a diagram illustrating electron orbits of emitted electrons detected by the scanning electron microscope 100G.

FIG. 21A is a schematic configuration diagram of a scanning electron microscope 100H.

FIG. 21B is a detection surface of a detector of the scanning electron microscope 100H.

FIG. 22 is an example of a hardware configuration of a depth calculation device 1300.

DESCRIPTION OF EMBODIMENTS

Hereinafter, embodiments of the invention will be described in detail based on drawings. In all the drawings for describing the present embodiment, components having the same function are denoted by the same reference numerals, and the repetitive description thereof will be omitted in principle. However, the invention should not be construed as being limited to a content of a description of the embodiments described below. It will be easily understood by those skilled in the art that the specific configuration may be modified without departing from a spirit or a scope of the invention.

First Embodiment

FIG. 1 illustrates a configuration example of a scanning electron microscope 100 according to the present embodiment. The scanning electron microscope 100 includes an imaging unit 101, an overall control unit 102, a signal processing unit 103, an input-output unit 104, and a storage unit 105.

The imaging unit 101 of the scanning electron microscope 100, which will be described in detail later, includes a detection unit that detects, among emitted electrons generated from a sample by irradiating the sample with a primary electron beam, emitted electrons of which an emission angle is in a predetermined range, the emission angle being an angle formed between an axial direction of the primary electron beam and an emission direction of the emitted electrons from the sample; and outputs a detection signal corresponding to the number of the emitted electrons which are detected. Specifically, the imaging unit 101 includes an electron gun 106, an acceleration electrode 108 that accelerates an electron beam (primary electron beam) 107 emitted from the electron gun 106, a focusing lens 109 that focuses the electron beam 107, a scanning deflector 110 that deflects an orbit of the electron beam 107, an objective lens 111 that controls a height of the focused electron beam 107, a stage 113 on which a sample 112 to be imaged is placed, a control lens 115 that controls orbits of emitted electrons 114 generated from the sample 112 by irradiating with the electron beam 107, a detection aperture stop 116 for discriminating electron to be detected among the emitted electrons 114 based on an emission angle, a separator 117 that controls an orbit of an emitted electron that passes through the detection aperture stop 116 among the emitted electrons 114 to move toward a detector 118, and the detector 118 that detects the emitted electron 114 whose orbit is controlled by the separator 117 and converts the detected emitted electron into a signal. Intensity of the signal output from the detector 118 varies depending on the number of the detected emitted electrons 114. Further, the separator 117 needs to generate a Wien condition that selectively deflects the emitted electron 114 without deflecting the electron beam 107. Therefore, a deflector (Wien filter) that generates an orthogonal electromagnetic field can be used for the separator 117.

The scanning electron microscope 100 according to the present embodiment can selectively detect only the emitted electrons 114 whose emission angle is equal to or less than a certain zenith angle (an angle to a direction perpendicular to a sample surface when the sample surface is viewed as a plane, corresponding to an angle formed between an axial direction of the electron beam 107 with which the sample 112 is irradiated and an emission direction of the emitted electron 114 from the sample surface) $A_Z$. The zenith angle $A_Z$ is referred to as a detection boundary angle. In this embodiment, the detection boundary angle $A_Z$ of emitted electrons 114 to be detected by the detector 118 are controlled by the control lens 115 and the detection aperture stop 116. For example, the control lens 115 is an electrostatic lens, and by changing the electrostatic intensity of the control lens 115, the orbits of the emitted electrons 114 that pass through the control lens 115 are converged or diverged, so that a range of the emission angles of the emitted electrons that pass through the detection aperture stop 116 is controlled.

Each mechanism of the imaging unit 101 is controlled by the overall control unit 102 that receives an instruction from an operator via a user interface of the input-output unit 104. The signal output from the detector 118 is converted into an image format by the signal processing unit 103 according to an instruction from the overall control unit 102, and is stored in the storage unit 105. Image signal of the image converted by the signal processing unit 103 also has a value corresponding to the number of emitted electrons 114 emitted when the position of the image is irradiated with the electron beam 107. In addition, the imaging unit 101 in FIG. 1 only illustrates a typical configuration, and is not limited to the illustrated configuration. For example, the scanning deflector 110 only needs to be disposed at a position closer to the electron gun 106 relative to the sample 112, and the illustrated arrangement is merely an example.

FIG. 2A is a schematic view illustrating a state of electron emission accompanying electron beam irradiation on a sample in which a groove is formed. Further, FIG. 2B is a graph (schematic diagram) illustrating an emission angle distribution of electrons detected by the detector (hereafter, referred to as detected electrons) among the emitted electrons generated when the sample in which the groove is formed is irradiated with an electron beam. As an example, in the sample, a line space pattern 201 extending in a Y direction perpendicular to an X direction is formed on an lower layer 202, and FIG. 2A illustrates a cross section in an XZ plane. An emission angle distribution 208 of detected electrons which are emitted electrons 205 emitted by irradiating a flat area on an upper surface of the pattern 201 with the electron beam 203 has a symmetrical shape centered around a position where the emission angle is around 45 degrees as illustrated in FIG. 2B. Meanwhile, in an emission angle distribution 209 of the detected electrons which are emitted electrons 206 emitted from the lower layer 202 by irradiating a central position of the groove with an electron beam 204, the number of detected electrons is maximum at an opening angle A of the groove as shown in FIG. 2B, and decreases at emission angles greater than the opening angle A. The opening angle A here is an angle formed between a straight line that passes through an upper end of a side wall of the pattern 201 facing the groove from the central position of the groove irradiated with the electron beam 204 in the XZ plane and an optical axis direction (corresponding to a line perpendicular to a bottom surface of the groove) of the electron beam 204.

The reason why such an emission angle distribution is formed is that due to the side walls of the pattern 201, among the emitted electrons 206 emitted from an irradiation point of the electron beam 204 (in this example, the central position of the groove), emitted electrons whose emission angles are equal to or larger than the opening angle A are shielded by the side wall and do not reach the detector. In this embodiment, a depth of a three-dimensional structure, such as a groove or a hole formed in the sample, is obtained based on this emission angle distribution. That is, as illustrated in FIG. 2B, the opening angle A can be obtained as an emission angle of a change point 210 where the emission angle distribution of the detected electrons changes due to a shielding effect. The depth of the three-dimensional structure geometrically formed in the sample can be obtained based on the opening angle A and a separately obtained groove width.

The number of emitted electrons emitted from the sample also changes depending on a material of the sample. However, the phenomenon that electrons emitted at an emission angle equal to or larger than the opening angle are shielded by the side wall of the pattern occurs regardless of the material constituting the sample and a size of the sample. Therefore, FIG. 2A illustrates an example in which the pattern 201 and the lower layer 202 are formed of materials having different electron emission rates, but a detection principle of this embodiment can be applied on a sample no matter what kind of material or a combination of the materials the sample is formed of.

FIG. 3 illustrates an example of a flowchart for calculating a groove depth based on the above-described principle. Firstly, in order to acquire the emission angle distribution of detected electrons illustrated in FIG. 2B, a plurality of images are acquired while sweeping the detection boundary angles $A_Z$ (S301). Specifically, the control lens 115 is controlled by the overall control unit 102, and N images $I_Z$ captured at a plurality of (N) detection boundary angles $A_Z=\{A_0, A_1, A_2, \ldots, A_{N-1}\}$ are stored in the storage unit 105. Although not particularly limited, $A_k$ (k=0 to N-1) is any monotonically increasing number sequence in a range of $0 \leq A_k \leq 90°$.

Subsequently, based on (Equation 1), the signal processing unit 103 obtains an absolute value of differences between images $I_k$ to obtain N angle sweep images $D_k$ whose emission angles of detected electrons are in a range of $A_k$ to $A_k+1$ (S302).

[Equation 1]

$$D_k=|I_{k+1}-I_k| \qquad \text{(Equation 1)}$$

FIG. 4 illustrates acquired images $D_0$, $D_1$, $D_{17}$ (schematic diagrams) when sweeping at a value of the detection boundary angle $A_k$ being 5 degrees. In this schematic diagram, a signal value of the image in the groove (bottom) of the sample is illustrated with attention, and for clarity, the signal value of the image in the groove in this schematic diagram is indicated by an x mark to represent a signal value of the image of a central part of the groove (bottom). The signal value of the sweep image $D_k$ corresponds to an integrated value of the emission angle distribution illustrated in FIG. 2B. Accordingly, a signal value of a groove image 401 of the image Do appears in magnitude corresponding to an integral value (area of a region 401A) of the emission angle distribution 209 with the emission angle of 0 to 5 degrees, a signal value of a groove image 402 of the image $D_1$ appears in magnitude corresponding to an integral value (area of a region 402A) of the emission angle distribution 209 with the emission angle of 5 to 10 degrees, and a signal value of a groove image 403 of the image $D_{17}$ appears in magnitude corresponding to an integral value (area of a region 403A) of the emission angle distribution 209 with the emission angle of 85 to 90 degrees. Therefore, it can be said that, on the sweep images $D_k$, the emission angle of the sweep image $D_k$ of which the signal value of the groove image is the largest corresponds to the opening angle A illustrated in FIG. 2A.

In the actual sweep image $D_k$, the flat area on the upper surface of the pattern 201 also changes in a manner corresponding to integral values of the emission angle distribution 208, but these changes are ignored in the schematic diagram of the sweep image in FIG. 4.

Next, a coordinate of the central position (the x mark in the image $D_k$ in FIG. 4) of the groove (a groove center coordinate) is obtained (S303). In order to obtain an emission angle distribution of detected electrons when the central position of the groove is irradiated with the electron beam, the groove center coordinate of the sample is obtained. FIG. 5 schematically illustrates a cross-sectional shape of the sample having the groove, an image I with the detection boundary angle $A_Z$ of 90 degrees, and a magnitude (here referred to as a signal waveform) of a signal value of the image taken along a line a-b illustrated in the image I. Two maximum peaks 501 of an image signal are detected by analyzing the signal waveform. Since the maximum peaks 501 of the image signal appears on the side walls of the groove, a groove center coordinate 502 can be obtained by calculating a middle position therebetween. With respect to the detection boundary angle $A_Z$ of the image I used for calculating the groove center coordinate, the image I with $A_Z$ of 90 degrees has a highest S/N, so that it is used for deriving the groove center coordinate.

Subsequently, the emission angle distribution of the detected electrons at the central position of the groove is obtained (S304). Specifically, with respect to each of the angle sweep images $D_k$ acquired in step S302, a signal value of the image at the groove center coordinate 502 is obtained, a median value of a range of the emission angles of the angle sweep images is plotted on a horizontal axis, and the signal value of the image is plotted on a vertical axis. A graph 601 (schematic diagram) of the obtained emission angle distribution of detected electrons at the central position of the groove is illustrated in FIG. 6. A change point 602 is obtained from the graph 601, and an emission angle at the change point 602 is set as the opening angle A (S305). The change point 602 is a point where attenuation of the signal intensity starts sharply due to the shielding by the side wall of the three-dimensional structure of the sample. Meanwhile, even if such shielding does not exist, the emission angle distribution as illustrated in FIG. 2B illustrates a distribution in which a trend changes from increasing to decreasing at a boundary which is the emission angle of 45 degrees. Therefore, when being in a range of 0 to 45 degrees, the opening angle A can be obtained as an emission angle at which the signal value of the image is maximized, and when being in a range of 45 degrees to 90 degrees, the opening angle A can be obtained as an emission angle at which a second derivative obtained by differentiating the graph 601 is minimized.

In order to geometrically obtain a depth H of the three-dimensional structure of the sample based on the opening angle A, a groove width L is calculated (S306). Similarly to the case of obtaining the groove center coordinate, the two maximum peaks 501 of the image signal appearing on the side walls of the groove are detected by analyzing the signal waveform, and a distance therebetween is defined as the groove width L.

When A indicates the opening angle and L indicates a groove width, the groove depth can be calculated by $H=L/(2 \tan A)$ (S307).

FIG. 7 illustrates an example of an input-output screen 701 that relates to calculation of the depth of the three-dimensional structure of the sample, and is displayed on a monitor of the input-output unit 104. By inputting an emission angle sweep range 702 and an emission angle sweep interval 703, a detection boundary angle $A_k$ (k=0 to N−1) of an image to be captured to obtain the emission angle distribution of the detected electrons is determined. A graph 704 of the emission angle distribution of detected electrons obtained after the image is captured, an opening angle 705 obtained from the graph, a measured groove width 706, and a finally calculated depth 707 are displayed.

The example of sweeping the value of the detection boundary angle $A_k$ by 5 degrees as a whole is illustrated, but a sweep range close to the change point obtained based on a first sweep is limited, a sweep interval is made smaller than an interval of the first sweep for a second sweep, and the change point is updated from an captured image, so that the measurement can be performed with higher precision.

In addition, an example in which the change point 602 is extracted by performing analysis such as a peak detection or a differentiation process from the graph of the obtained emission angle distribution is described (see, FIG. 6), but the opening angle A can also be obtained by performing a regression analysis using a fitting function calculated in advance on the graph 601 of the detected electron emission angle distribution obtained from the measurement result. By applying the fitting function, the change point can be extracted accurately even when noise included in the image is large. For this reason, points for acquiring images sweeping the emission angle can be reduced, and a measurement time can be shortened. The fitting function can be prepared based on simulation results.

In the present embodiment, the example of measuring the groove depth of the sample is described, but the invention also can be applied to measurement of a depth of a hole or a three-dimensional structure (pillar structure, fin structure, and the like) formed in a sample other than the hole. The same applies to the embodiment to be described.

Second Embodiment

The first embodiment describes an example in which the image signal at the central position of the hole or the groove is used for depth measurement, but the present embodiment describes an example in which image signals at a plurality of positions at a bottom of a hole, a groove, or a three-dimensional structure other than the hole and the groove are used, so as to improve accuracy of the depth measurement. The configuration of the scanning electron microscope according to the present embodiment is the same as the configuration of the first embodiment illustrated in FIG. 1, and descriptions thereof are omitted.

FIG. 8 is a flowchart for calculating the groove depth according to the second embodiment. First, angle sweep images are acquired (S801, S802) by the same procedure (S301, S302) as in the first embodiment. Next, in order to acquire an emission angle distribution of detected electrons when a plurality of positions in the groove is irradiated with an electron beam, a plurality of signal analysis positions $x_i$ are obtained inside the groove of the sample (S803). As illustrated in FIG. 5, by analyzing the signal waveform of the image, two maximum peaks 501 of the signal appearing on the side walls of the groove are detected, and a plurality of positions $x_i$ from which the emission angle distribution is acquired are specified therebetween. $x_i$ may be any position in the groove. Also in this case, it is desirable to specify the position $x_i$ in the groove using the image I with $A_Z$ of 90 degrees.

FIG. 9 illustrates an example of the signal analysis position $x_i$ and opening angles at this time. A signal analysis position $x_j$ in this example is closer to a left side wall than the groove center coordinate, and the distances to the left side wall and a right side wall are different. For this reason, an opening angle with respect to the left side wall is A1, and it is different from an opening angle with respect to the right side wall A2 in the left and right.

Subsequently, an emission angle distribution of the detected electrons is obtained for each signal analysis position $x_i$ (S804). Specifically, with respect to each of the angle sweep images $D_k$ acquired in step S802, a signal value of the image at the signal analysis position $x_i$ of the groove is obtained, a median value of a range of the emission angles of the angle sweep images is plotted on a horizontal axis, and the signal value of the image is plotted on a vertical axis. A graph 1001 (schematic diagram) of the emission angle distribution at the signal analysis position $x_j$ shown in FIG. 9 is illustrated in FIG. 10.

In this case, change points 1002, 1003 of the graph 1001 appear corresponding to the left opening angle $A_1$ and the right opening angle $A_2$. Accordingly, two change points 1002, 1003 of the value of the image signal are obtained, and a sum of the emission angles corresponding to the change points is set as a total opening angle $A_j$ (=$A_1+A_2$) (S805). Therefore, as same as the first embodiment, when being in a range of 0 to 45 degrees, the opening angle on the left side (right side) can be obtained as an emission angle at which the signal value of the image is maximized, and when being in a range of 45 degrees to 90 degrees, the opening angle on the left side (right side) can be obtained as an emission angle at which a second derivative obtained by differentiating the graph 1001 is minimized.

A depth H of the groove is obtained based on a relationship between the signal analysis position $x_j$ in the groove and the total opening angle $A_j$ at that time. FIG. 11A illustrates a graph 1101 in which the total opening angles $A_j$ obtained with respect to the signal analysis position $x_j$ are plotted. The depth H is obtained by performing regression analysis on this graph using a fitting function 1102 based on a geometric structure of the sample. The fitting function 1102 is expressed by (Equation 2).

[Equation 2]

$$A_i = \arccos \frac{(H^2 + x_i^2 - Lx_i)}{\sqrt{H^2 + x_i^2}\sqrt{H^2 + (L-x_i)^2}} \quad \text{(Equation 2)}$$

This fitting function can be derived from a cosine theorem holding true in a triangle OPQ illustrated in FIG. 11B. The triangle OPQ is a triangle formed by the signal analysis position $x_j$ in the XZ plane and upper ends of the side walls of a line. The cosine theorem that holds true in the triangle OPQ is illustrated in (Equation 3).

[Equation 3]

$$L^2 = l_1^2 + l_2^2 - 2l_1 l_2 \cos A_j \quad \text{(Equation 3)}$$
$$A_j = A_1 + A_2, l_1 = \sqrt{H^2 + x_j^2},$$
$$l_2 = \sqrt{H^2 + (L - x_j)^2}$$

In this embodiment, the total opening angle at a plurality of signal analysis positions is used to calculate the groove depth H, so that effect of measurement error at each opening angle can be reduced.

In the present embodiment, the depth measurement for the hole can be performed in the same manner as in the first embodiment. However, as illustrated in FIG. 12A, when the hole is irradiated with an electron beam, the opening angle changes according to the azimuth angle. FIG. 12A illustrates a state in which a hole 1210 and a groove 1211, which are representative examples of the three-dimensional structure, are viewed from above. In a case where the signal analysis position $x_j$ is set in the groove 1211, planes including $\alpha_2\beta_2$ or $\alpha_3\beta_3$ have no side wall, and emitted electrons are not shielded. Accordingly, in a case of the hole 1210, the emitted electrons are shielded by a side wall crossing the plane including $\alpha_2\beta_2$ or $\alpha_3\beta_3$. For this reason, a signal detected by the detector includes information on an infinite number of opening angles with different magnitudes, and the information is obtained when the hole is cut by an infinite number of planes which are perpendicular to an XY plane. Therefore, when measuring the depth of the hole 1210, directions of the emitted electrons to be detected are limited to one direction, so that the measurement can be performed by the same process as in the case of the groove. Specifically, as illustrated in FIG. 12B, the emitted electrons 114 from a bottom of the hole 1210 of the sample 112 are allowed to pass through an electron passage restricting member 1201 provided with a slit 1202, and are detected by the detector 118. An azimuth angle of the emitted electrons spreads in all directions as indicated by an azimuth angle 1203 before passing through the slit 1202. By passing through the slit 1202, an azimuth angle of the emitted electrons 114 is limited to one azimuth angle 1204 in a longitudinal direction of the slit 1202. The longitudinal direction of the slit 1202 and a direction extending along a straight line in which the signal analysis position $x_j$ is set are made to coincide with each other, and the hole depth H can be obtained by performing the process same as the case of the groove on the emitted electrons after passing through the slit 1202 of the electron passage restricting member 1201.

In the first and second embodiments, the configuration of the scanning electron microscope for calculating the depth of the three-dimensional structure formed in the sample is not limited to the configuration illustrated in FIG. 1. The scanning electron microscope 100 illustrated in FIG. 1 has a configuration (referred to as "emission angle low-pass configuration") in which emitted electrons having an emission angle that is equal to or lower than the certain zenith angle $A_Z$ are selectively detected, but in contrast, in a configuration (referred to as "emission angle high-pass configuration") in which emitted electrons having an emission angle that is equal to or larger than the certain zenith angle $A_Z$ are selectively detected, the depth of the three-dimensional structure can be measured in the same manner. Hereinafter, other configuration examples of the scanning electron microscope will be described.

A scanning electron microscope 100A illustrated in FIG. 13 has the emission angle high-pass configuration. The orbits of the emitted electrons 114 are controlled by the control lens 115, and tertiary electrons 120 generated by being reflected from a reflection plate 119 having an opening portion at the center are detected by the detector 118. With this configuration, an emission angle distribution of the detected electrons can be obtained by selectively detecting emitted electrons having emission angles that cannot pass through the opening portion of the reflection plate 119.

A scanning electron microscope 100B illustrated in FIG. 14 also has the emission angle high-pass configuration. The orbits of the emitted electrons 114 are controlled by the control lens 115, and the emitted electrons 114 are detected by a donut-shaped annular detector 121 having an opening portion at the center. With this configuration, an emission angle distribution of the detected electrons can be obtained by selectively detecting emitted electrons having emission angles that cannot pass through the opening portion of the annular detector 121.

A scanning electron microscope 100C illustrated in FIG. 15 has the emission angle low-pass configuration. The separator 117 controls the orbits of the emitted electrons 114 to be away from an optical axis of the primary electron beam 107, and the detection boundary angle $A_Z$ in the detector 118 is controlled by the control lens 115 and the detection aperture stop 116 outside the optical axis. Therefore, orbits of emitted electrons are controlled by the control lens 115 while reducing influence of a magnetic field of the control lens 115 on emission angles of the emitted electrons 114, and an emission angle distribution of the detected electrons can be obtained by selectively detecting emitted electrons having emission angles that can pass through an opening portion of the detection aperture stop 116.

A scanning electron microscope 100D illustrated in FIG. 16 has the emission angle low-pass configuration. A detection boundary angle $A_Z$ is controlled by a diameter-variable detection aperture stop 122 that can control a diameter of an opening portion. The overall control unit 102 controls the diameter of the opening portion of the diameter-variable detection aperture stop 122, such that an emission angle distribution of the detected electrons can be obtained by selectively detecting emitted electrons having emission angles that can pass through the opening portion.

A scanning electron microscope 100E illustrated in FIG. 17 has the emission angle high-pass configuration. A detection boundary zenith angle $A_Z$ is controlled by a donut-shaped position-variable annular detector 123 having an opening portion in the center and whose installation position can be controlled by the overall control unit 102 in the optical axis direction of the primary electron beam 107. The control of the detection boundary zenith angle $A_Z$ can be implemented not only by controlling a position in a vertical direction (optical axis direction), and also can be implemented by the control of expanding a diameter of the opening portion of the annular detector in a horizontal direction (direction perpendicular to the optical axis direction). With this configuration, since the orbits of the emitted electrons 114 are allowed to reach the detector 123 while maintaining linearity without bending, the orbits of the emitted electrons 114 are prevented from being bent by a magnetic field of the objective lens 111 by placing the objective lens 111 above the detector 123. An emission angle distribution of the detected electrons can be obtained by controlling a position of the detector 123 and selectively detecting emitted electrons having emission angles that cannot pass through the opening portion.

A scanning electron microscope 100F illustrated in FIG. 18 also has the emission angle high-pass configuration. A detection boundary angle $A_Z$ is controlled by a height-variable stage 124 whose height (an optical axis direction of the primary electron beam 10) can be controlled by the overall control unit 102 and the donut-shaped annular detector 121 having the opening portion at the center. Also with this configuration, since the orbits of the emitted electrons 114 are allowed to reach the detector 123 while maintaining the linearity without bending, the objective lens 111 is disposed above the detector 123. An emission angle distribution of the detected electrons can be obtained by controlling the height of the stage and selectively detecting emitted electrons having emission angles that cannot pass through the opening portion of the annular detector 121.

A scanning electron microscope 100E illustrated in FIG. 19 has the emission angle low-pass configuration. A detection boundary angle $A_Z$ is controlled by a separator 125 that controls orbits of emitted electrons 114 and an electron passage restricting member 126 having a slit 127 that allows only emitted electrons having an azimuth angle in one direction to pass therethrough. As illustrated in FIG. 20, the emitted electrons 114 emitted from the sample 112 are deflected to the slit 127 of the electron passage restricting member 126 by the separator 125, and only emitted electrons 114 whose azimuth angles are in a longitudinal direction of the slit 127 pass through. An emission angle distribution of the detected electrons can be obtained by the separator 125 controlled by the overall control unit 102 controlling orbit of electrons toward the electron passage restricting member 126, and selectively detecting emitted electrons having emission angles that pass through the slit 127. It is suitable for measuring a depth of a three-dimensional structure in which the opening angle changes according to the azimuth angle.

A scanning electron microscope 100H illustrated in FIG. 21A includes a detector that can simultaneously acquire images having different detection boundary angles $A_Z$. FIG. 21B illustrates a detection surface of a multichannel detector 128 used in the scanning electron microscope 100H. In this example, the multichannel detector 128 has detection units 131 to 134, and each of them can independently detect emitted electrons. For example, the emitted electrons to be detected are formed to an image based on a detection signal of the detection unit 131, an image based on detection signals of the detection units 131 to 132, an image based on detection signals of the detection units 131 to 133, and an image based on detection signals of the detection units 131 to 134, such that images having different detection boundary angles $A_Z$ can be simultaneously acquired without performing sweeping. This makes it possible to acquire the emission angle distribution of the detected electrons at high speed.

The above embodiments describe examples of the electron microscope having a function of calculating the depth of the three-dimensional structure formed in the sample, and it may also be a depth calculation device or a depth calculation system in which among emitted electrons generated from a sample by irradiating the sample with a primary electron beam, emitted electrons of which an emission angle is in a predetermined range are detected, the emission angle being an angle formed between an optical axis direction of the primary electron beam and an emission direction of the emitted electrons from the sample, and a depth of a three-dimensional structure is calculated based on images captured by an electron microscope having a detection unit that outputs a detection signal corresponding to the number of the emitted electrons which are detected. FIG. 22 is an example of a hardware configuration of a depth calculation device. A depth calculation device 1300 includes a processor 1301, a main memory 1302, an auxiliary memory 1303, an input-output interface 1304, a display interface 1305 and a network interface 1306, and these are coupled by a bus 1307. The input-output interface 1304 is connected to an input device 1309 such as a keyboard and a mouse, and the display interface 1305 is connected to a display 1308 to realize a GUI. Further, an evaluation result is displayed by the image as illustrated in FIG. 7. The network interface 1306 is an interface for connecting to a network. For example, by connecting to the scanning electron microscope 100 via a network, images stored in the storage unit 105 of the electron microscope 100 can be stored in the auxiliary memory 1303 via the network. The auxiliary memory 1303 is usually configured with a nonvolatile memory such as an HOD, a ROM, or a flash memory, and stores a program to be executed by the depth calculation device 1300, data to be processed by the program, and the like. The main memory 1302 is configured with a RAM, and temporarily stores a program, data necessary for executing the program, and the like according to instructions from the processor 1301. The processor 1301 executes a program loaded from the auxiliary memory 1303 to the main memory 1302. The depth calculation device 1300 can be implemented by a personal computer (PC) or a server.

The auxiliary memory 1303 stores a plurality of images $I_Z$ 1310 obtained by varying a detection boundary angle $A_Z$ for a same sample, a depth calculation program 1311 for calculating a depth of a three-dimensional structure of the sample, and other programs. The depth calculation program 1311 is a program for executing a process of calculating the depth of the three-dimensional structure which is performed by the signal processing unit 103 in the first and second embodiments described above. Specifically, the image $I_Z$ 1310 is used to execute the processes of S302 to S307 illustrated in FIG. 3, or S802 to S806 illustrated in FIG. 8.

REFERENCE SIGN LIST 100, 100A, 100B, 100C, 100D, 100E, 100F, 100G, 100H: Scanning electron microscope
101: Imaging unit
102: Overall control unit
103: Signal processing unit
104: Input-output unit
105: Storage unit
106: Electron gun
107: Electron beam
108: Acceleration electrode
109: Focusing lens
110: Scanning deflector
111: Objective lens
112: Sample
113: Stage
114: Emitted electrons
115: Control lens
116: Detection aperture stop
117, 125: Separator
118: Detector
119: Reflection plate
120: Tertiary electron
121: Annular detector
122: Diameter-variable detection aperture stop
123: Position-variable annular detector
124: Height-variable stage
126: Electron passage restricting member
127: Slit
128: Multichannel detector
131, 132, 133, 134: Detection unit
201: Line space pattern
202: Lower layer
203, 204: Electron beam
205, 206: Emitted electrons
208, 209: Emission angle distribution
210: Change point
401, 402, 403: Groove image
501: Maximum peak
502: Groove center coordinate
601, 1001, 1101: Graph
602, 1002, 1103: Change point
701: Input-output screen
1102: Fitting function
1210: Hole
1211: Groove
1201: Electron passage restricting member
1202: Slit
1203, 1204: Azimuth angle
1300: Depth calculation device
1301: Processor
1302: Main memory
1303: Auxiliary memory
1304: Input-output interface
1305: Display interface
1306: Network interface
1307: Bus
1308: Display
1309: Input device
1310: Image
1311: Depth calculation program

The invention claimed is:

1. An electron microscope comprising:
an electron gun configured to irradiate a sample formed in a three-dimensional structure with a primary electron beam;
an electron detector configured to detect, among emitted electrons generated from the sample by irradiating the sample with the primary electron beam, emitted electrons whose emission angles are in a predetermined range, the emission angle being an angle formed between an optical axis direction of the primary electron beam and an emission direction of the emitted electrons from the sample, and to output a detection signal corresponding to the number of the emitted electrons which are detected;
a control processor configured to control a range of the emission angles of the emitted electrons detected by the detection unit; and
a signal processor, wherein
the control processor is configured to set a plurality of ranges of emission angles of the emitted electrons detected by the electron detector, and
the signal processor is configured to obtain an emission angle distribution of a plurality of detection signals based on the plurality of detection signals output by the electron detector, the detection signals being obtained by detecting emitted electrons having emission angles in each of the plurality of ranges of emission angles set by the control processor, the emitted electrons being generated by causing the electron gun to irradiate a bottom portion of the three-dimensional structure with the primary electron beam, and to obtain an opening angle based on a change point of the emission angle distribution, the opening angle being an angle formed between the optical axis direction of the primary electron beam and a straight line that passes through a position irradiated with the primary electron beam in the bottom portion of the three-dimensional structure and an upper end of a side wall of the three-dimensional structure.

2. The electron microscope according to claim 1, wherein the signal processor is configured to obtain a width of the three-dimensional structure based on the detection signals from the electron detector, and to obtain a depth of the three-dimensional structure based on the opening angle and the width of the three-dimensional structure.

3. The electron microscope according to claim 2, wherein the signal processor is configured to obtain a width of the three-dimensional structure based on detection signals output by the electron detector, the detection signals being obtained by detecting emitted electrons having emission angles in a range of emission angles equal to or lower than 90 degrees.

4. The electron microscope according to claim 1, further comprising:
a control lens configured to control an orbit of the emitted electron and a detection aperture stop,
wherein the electron detector is configured to detect an emitted electron whose orbit is changed by the control lens and passed through the detection aperture stop, and
wherein the control processor is configured to control the control lens according to the range of emission angles of the emitted electrons detected by the electron detector.

5. The electron microscope according to claim 1, further comprising:
a control lens configured to control an orbit of the emitted electron and a reflection plate, wherein the electron detector is configured to detect a tertiary electron generated when the emitted electron whose orbit is changed by the control lens is reflected by the reflection plate, and wherein the control processor is configured to control the control lens according to the range of emission angles of the emitted electrons detected by the electron detector.

6. The electron microscope according to claim 1, further comprising:

a control lens configured to control an orbit of the emitted electron, and an annular detector configured to detect an emitted electron whose orbit is changed by the control lens, wherein the control processor is configured to control the control lens according to the range of emission angles of the emitted electrons detected by the electron detector.

7. The electron microscope according to claim 1, further comprising:

a diameter-variable detection aperture stop whose opening portion has a controllable diameter, wherein the electron detector is configured to detect an emitted electron passing through the diameter-variable detection aperture stop, and wherein the control processor is configured to control the diameter of the opening portion of the diameter-variable detection aperture stop according to the range of emission angles of the emitted electrons detected by the electron detector.

8. The electron microscope according to claim 1, wherein the electron detector comprises an annular detector disposed between an objective lens and the sample, and the control processor is configured to control a position of a stage on which the sample is placed or a position of the annular detector along the optical axis direction of the primary electron beam according to the range of emission angles of the emitted electrons detected by the electron detector.

9. The electron microscope according to claim 1, further comprising an electron passage restricting member having a slit restricting an azimuth angle of the emitted electrons.

10. A calculation method for a depth of a three-dimensional structure that calculates the depth of the three-dimensional structure depth based on an image formed by detecting emitted electrons generated from a sample formed in the three-dimensional structure by irradiating the sample with a primary electron beam, the calculation method comprising:

storing, in a storage unit, a plurality of images for the sample obtained by varying a range of emission angles of the emitted electrons to be detected, the emission angle being an angle formed between an optical axis direction of the primary electron beam and an emission direction of the emitted electrons from the sample;

obtaining an emission angle distribution of image signals based on the image signals in a predetermined position of a bottom portion of the three-dimensional structure of the plurality of images stored in the storage unit;

obtaining an opening angle based on a change point of the emission angle distribution, the opening angle being an angle formed between the optical axis direction of the primary electron beam and a straight line passing through a predetermined position and an upper end of a side wall of the three-dimensional structure;

obtaining a width of the three-dimensional structure based on one image of the plurality of images stored in the storage unit; and obtaining a depth of the three-dimensional structure based on the opening angle and the width of the three-dimensional structure.

11. The calculation method for a depth of a three-dimensional structure according to claim 10, further comprising:

forming said one image by detecting emitted electrons in which a range of emission angles of emitted electrons to be detected is 90 degrees or less.

12. The calculation method for a depth of a three-dimensional structure according to claim 10, further comprising:

storing a fitting function of the emission angle distribution in advance; and obtaining an emission angle distribution of the image signal by applying the fitting function to an image signal in the predetermined position.

13. The calculation method for a depth of a three-dimensional structure according to claim 12, wherein the predetermined position is a central position of a bottom portion of the three-dimensional structure, or a plurality of positions on one straight line in the bottom portion of the three-dimensional structure.

14. The calculation method for a depth of a three-dimensional structure according to claim 10, further comprising:

obtaining the plurality of images by restricting azimuth angles of emitted electrons to be detected in one direction.

15. The calculation method for a depth of a three-dimensional structure according to claim 10, wherein the three-dimensional structure is a hole or a groove formed in the sample.

\* \* \* \* \*